(12) United States Patent
Segueni et al.

(10) Patent No.: US 8,593,239 B2
(45) Date of Patent: Nov. 26, 2013

(54) MEMS STRUCTURE WITH A FLEXIBLE MEMBRANE AND IMPROVED ELECTRIC ACTUATION MEANS

(75) Inventors: Karim Segueni, Lomme (FR); Nicolas Lorphelin, Lille (FR)

(73) Assignee: DELFMEMS, Villeneuve d'Ascq (FR)

( * ) Notice: Subject to any disclaimer, the term of this patent is extended or adjusted under 35 U.S.C. 154(b) by 0 days.

(21) Appl. No.: 13/203,884

(22) PCT Filed: Mar. 18, 2010

(86) PCT No.: PCT/EP2010/001701
§ 371 (c)(1),
(2), (4) Date: Aug. 30, 2011

(87) PCT Pub. No.: WO2010/105827
PCT Pub. Date: Sep. 23, 2010

(65) Prior Publication Data
US 2011/0315529 A1   Dec. 29, 2011

(30) Foreign Application Priority Data
Mar. 20, 2009   (EP) .................................. 09370007

(51) Int. Cl.
*H01H 51/22* (2006.01)
(52) U.S. Cl.
USPC ............................................................. 335/78
(58) Field of Classification Search
USPC .......................................................... 335/78
See application file for complete search history.

(56) References Cited

U.S. PATENT DOCUMENTS

| 5,638,946 | A | 6/1997 | Zavracky |
| 5,867,302 | A * | 2/1999 | Fleming ........................ 359/291 |
| 6,720,851 | B2 * | 4/2004 | Hallbjorner et al. ............ 335/78 |
| 7,342,472 | B2 * | 3/2008 | Charvet .......................... 335/78 |
| 7,477,884 | B2 * | 1/2009 | Choi et al. ................. 455/252.1 |
| 7,548,144 | B2 * | 6/2009 | Kim et al. ....................... 335/78 |
| 7,834,722 | B2 * | 11/2010 | Millet ............................. 335/78 |
| 2002/0191897 | A1 * | 12/2002 | Hallbjorner et al. ............ 385/18 |
| 2003/0178635 | A1 * | 9/2003 | Volant et al. .................. 257/108 |
| 2004/0050674 | A1 | 3/2004 | Rubel |
| 2004/0091203 | A1 | 5/2004 | Huber et al. |
| 2004/0207498 | A1 * | 10/2004 | Hyman et al. .................. 335/78 |
| 2005/0001701 | A1 | 1/2005 | Shirakawa |
| 2006/0181377 | A1 * | 8/2006 | Kweon et al. ................... 335/78 |
| 2006/0181379 | A1 * | 8/2006 | Schwartz et al. ............... 335/78 |

FOREIGN PATENT DOCUMENTS

| EP | 1343189 | A2 | 9/2003 |
| EP | 1 489 639 | A1 | 12/2004 |
| EP | 1672661 | A2 | 6/2006 |
| EP | 1705676 | A1 | 9/2006 |
| WO | WO-2004076341 | | 9/2004 |

* cited by examiner

*Primary Examiner* — Alexander Talpalatski
(74) *Attorney, Agent, or Firm* — Harness, Dickey & Pierce, P.L.C.

(57) ABSTRACT

The MEMS structure comprises: a flexible membrane (6), which has a main longitudinal axis (6a) defining a longitudinal direction (X), at least one pillar (3, 3') under the flexible membrane (6), electric lowering actuation means (7) that are adapted to bend down the flexible membrane (6) into a down forced state electric raising actuation means (8) that are adapted to bend up the flexible membrane (6) into an up forced state. The electric lowering actuation means (7) or the electric raising actuation means (8) comprise an actuation area (7c or 8c), that extends under a part of the membrane (6) and that is adapted to exert pulling forces on the membrane (6) simultaneously on both sides of the said at least one pillar (3) in the longitudinal direction (X).

28 Claims, 5 Drawing Sheets

MEMS STRUCTURE WITH A FLEXIBLE MEMBRANE AND IMPROVED ELECTRIC ACTUATION MEANS

CROSS-REFERENCE TO RELATED APPLICATIONS

Figure 1:
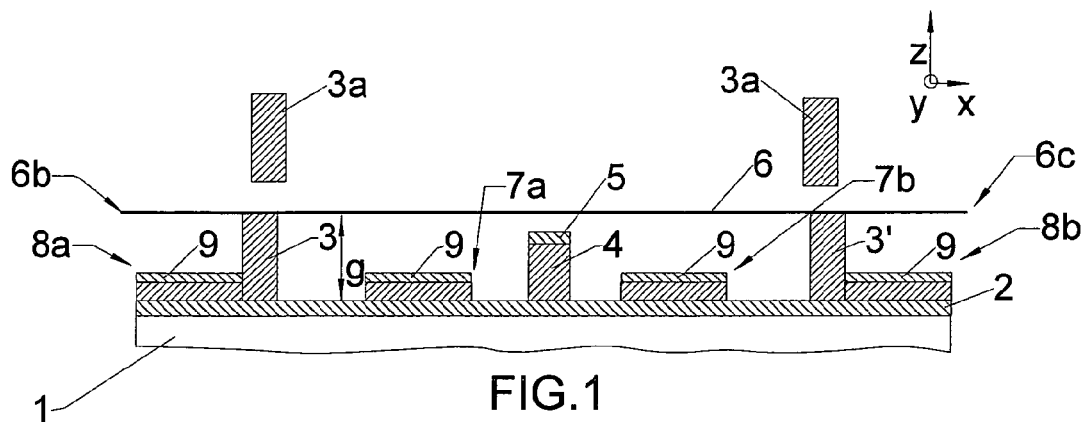

This application is a 371 U.S. National Stage of International Application No. PCT/EP2010/001701, filed Mar. 18, 2010. This application claims priority to European Patent Application No. 09370007.8, filed Mar. 20, 2009. The entire disclosures of the above applications are incorporated herein by reference.

TECHNICAL FIELD

The present invention relates to the technical field of Micro Electromechanical Systems (MEMS), and more especially to a novel MEMS structure having a flexible membrane and improved electric actuation means for bending said membrane. This novel MEMS structure can be used in various applications, and in particular can be advantageously used for example for making MEMS switches (ohmic contact switches or capacitive contact switches), more particularly Radio Frequency (RF) switches, or can be advantageously used for example for making optical MEMS structures, also called Micro-Opto-Electro-Mechanical Systems (MOEMS).

PRIOR ART

Micro Electromechanical Systems (MEMS) structures are now widely used for making RF switches (ohmic contact switches or capacitive contact switches) or optical switches. Theses MEMS structures are more particularly used in telecommunication systems, for making for example phased array antennas, phase shifters, switchable tuning components, etc.

A MEMS structure generally comprises micromechanical switching means that are movable between at least two positions, and electric actuation means that are adapted to generate forces onto the mechanical switching means in order to move the latter between their at least two positions.

Different actuation techniques can be used for implementing the electric actuation means of a MEMS structure. These electric actuation means can be electrostatic, electromagnetic, piezoelectric, or electrothermal actuation means. Electrostatic actuation is however the prevalent technique in use to date, since it enables to reach shorter switching times (typically less than 200 µs) and a virtually zero power consumption and a complete technological compatibility with classical CMOS process flow. Furthermore, in RF MEMS switch designs, different actuation techniques can be combined (for example an electrostatic voltage hold can be coupled with a thermal actuation).

The micromechanical switching means of a MEMS structure can comprise a movable rigid element, like for example a movable rigid beam, or a flexible membrane.

MEMS structure comprising a movable rigid switching element are described for example in US patent application 2005/0001701, or in European patent application EP-A-1 489 639.

The use of a flexible membrane enables however to achieve advantageously shorter switching times, compared to the use of movable rigid switching element.

The flexible membrane can be clamped at both ends on a substrate in order to form a bridge. MEMS structures comprising a switching element constituted by such a clamped-clamped flexible membrane are described in the following publications: US patent application 2004/0050674, US patent application 2004/0091203, European patent application EP-A-1 343 189, PCT application WO-A-2004/076341.

The flexible membrane can be also clamped on a substrate solely at one end in order to form a cantilever. MEMS structures comprising a switching element constituted by such a cantilever flexible membrane is disclosed for example in the U.S. Pat. No. 5,638,946.

The flexible membrane can also be freely supported on a substrate, as disclosed for example in European patent application EP-A-1 705 676. Such a free flexible membrane is advantageously subjected to a lower mechanical stress than clamped-clamped flexible membranes or cantilever membranes, and the lifetime of the MEMS structure is thus advantageously increased.

Figure 2:
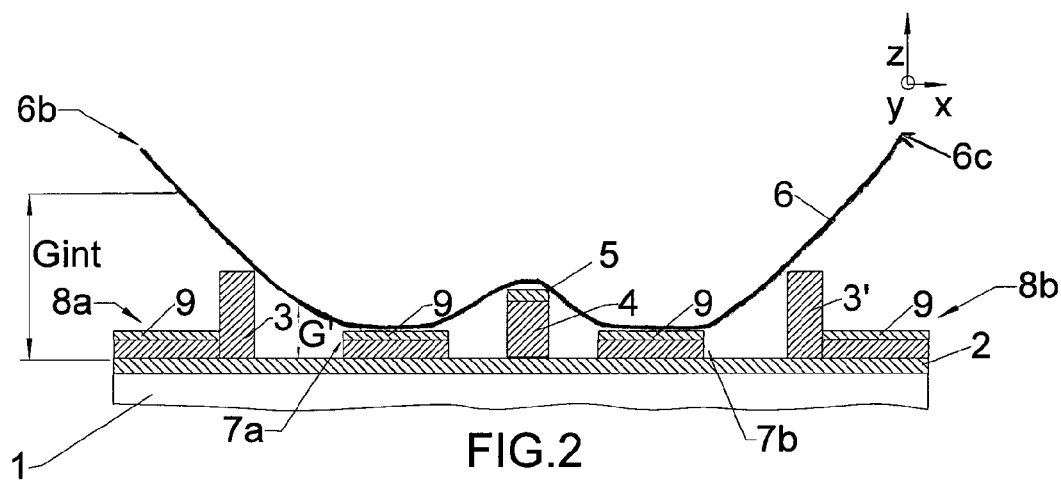

In the embodiment of FIGS. 1 and 2 of EP European patent application EP-A-1 705 676, the flexible membrane is freely supported on two pillars and is adapted to have two states: an up forced state (shown on FIG. 2) and a rest state (shown on FIG. 1). In order to bend the membrane into its up force state, the MEMS structure comprises electric raising actuation means that are adapted to bend the flexible membrane in order to raise the functional part of the membrane. In this particular embodiment the functional part of the membrane is the part of the membrane in-between the two pillars. These electric raising actuation means are more particularly constituted by two external electrodes, that are positioned under the membrane, between each end of the membrane and the closest pillar, and that are adapted to exert electrostatic pulling forces on both ends of the membrane, when an actuation voltage is applied on the electrodes. Theses pulling forces combined with a lever effect on the pillars enable to bend upwardly the membrane in it up force state. When the actuation voltage on the electrodes is zero, the membrane comes back to its rest position of FIG. 1, thanks to the stiffness of the membrane.

OBJECTIVE OF THE INVENTION

There is a need to have a MEMS structure with at least two forced states for the membrane, i.e. a MEMS structure wherein the flexible membrane can have an up forced state, and a down forced state, and if needed a rest state in-between the up forced state and down forced state.

Such a MEMS structure could be obtained for example from the embodiment of FIGS. 1 and 2 of EP European patent application by adding electric lowering actuation means that are adapted to bend down the flexible membrane in order to lower the functional part of the membrane, below the horizontal rest position of the membrane. These electric lowering actuation means can be for example constituted by additional internal electrodes that are positioned under the membrane, between the two pillars that support the membrane. Said internal electrodes are adapted to exert electrostatic pulling forces on the functional part of the membrane, when an actuation voltage is applied on the electrodes.

But with such a two forced states MEMS structure, in order to be able to make the membrane move between the up forced state and the down force state, without failure, and if needed at high rates, it is necessary:

to use a stiff membrane and large membrane deformations, in order to obtain a mechanical restoring force of the membrane that is sufficiently large for bending back the membrane towards its rest position, to use high actuation voltage, due to the large gap either between the membrane in its up forced state and the lowering actuation electrodes or between the membrane in its down forced state and the raising actuation electrodes; furthermore, the higher the stiffness of the membrane is, the higher the actuation voltage has to be.

Such increase of the actuation voltage is detrimental because it is energy consuming, particularly due to the addition of a DC/DC converter, and renders the MEMS structure more difficult to design, notably in terms of compactness constraints and manufacturing costs.

The objective of the invention is thus to propose a novel MEMS structure, which has a flexible membrane that can be actuated between at least an up forced state and a down forced state, and which has been improved in order to lower the actuation voltage and/or the stiffness of the membrane without prejudice for the efficiency of the MEMS structure. Within the scope of the invention, this MEMS structure can comprise an anchorless and freely supported flexible membrane of the type described in EP-A-1 705 676 or a flexible clamped-clamped membrane or a flexible cantilever membrane.

SUMMARY OF THE INVENTION

This objective is achieved by the novel MEMS structure defined in claim 1. This novel MEMS structure comprises:
a flexible membrane, which has a main longitudinal axis defining a longitudinal direction (X),
at least one pillar under the flexible membrane,
electric lowering actuation means that are adapted to bend down the flexible membrane into a down forced state,
electric raising actuation means that are adapted to bend up the flexible membrane into an up forced state,
and wherein the electric lowering actuation means or the electric raising actuation means comprise an actuation area, that extends under a part of the membrane and that is adapted to exert pulling forces on the membrane (6) simultaneously on both sides of the said at least one pillar (3) in the longitudinal direction (X).

This extension of the electric lowering actuation means or of the electric raising actuation means on both sides of the pillar in the longitudinal direction improves the actuation of the membrane from one forced state to the other.

Within the scope of the invention, the flexible membrane can be supported at rest by the said at least one pillar, or can be spaced apart from the said at least one pillar (i.e. not supported at rest by the said at least one pillar).

SHORT DESCRIPTION OF THE DRAWINGS

Figure 3:
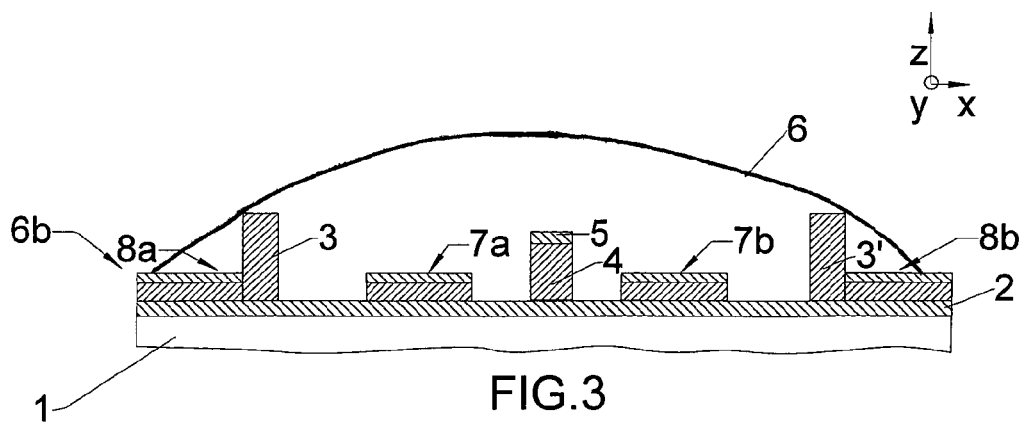
Figure 4:
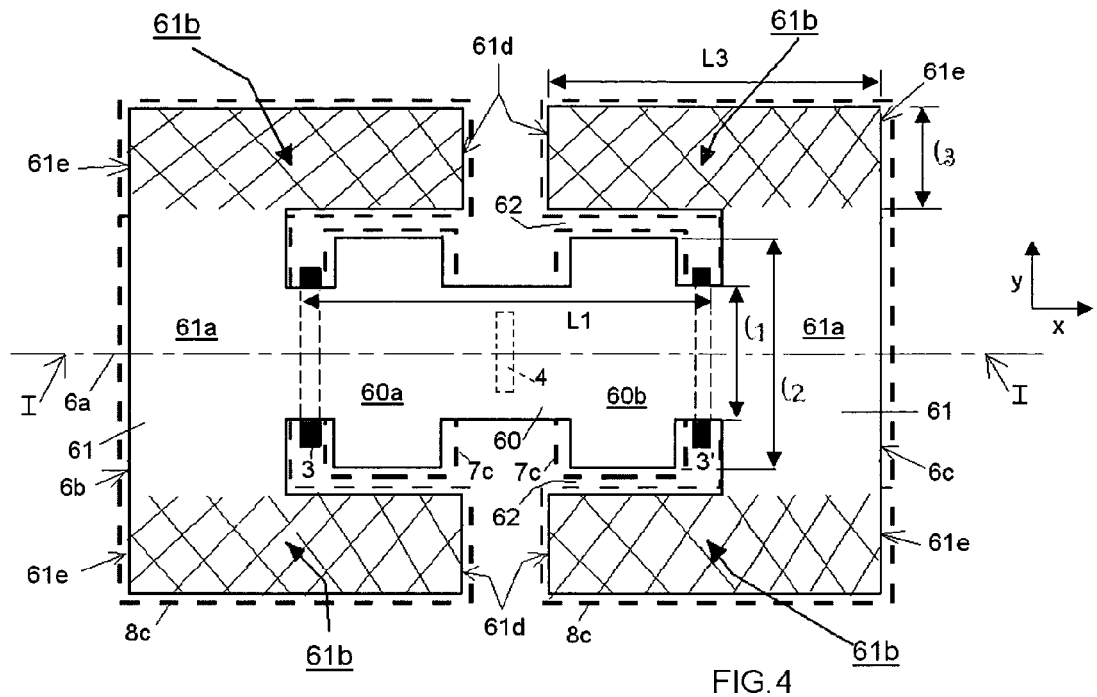
Figure 11:
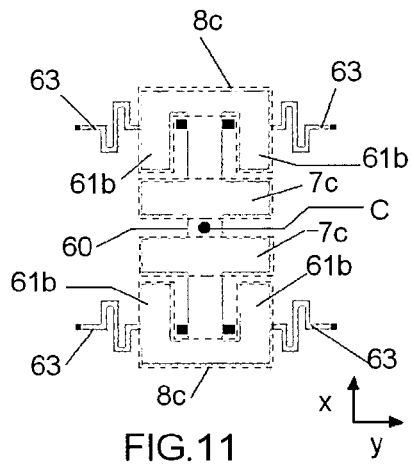
Figure 12:
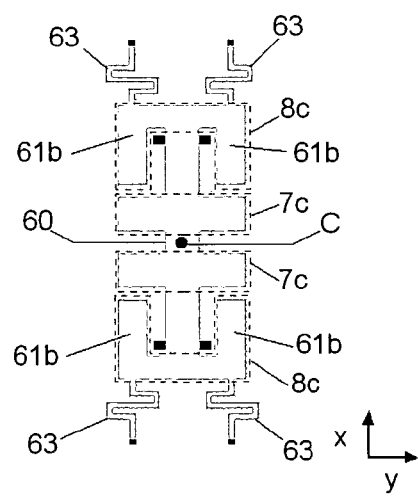
Figure 13:
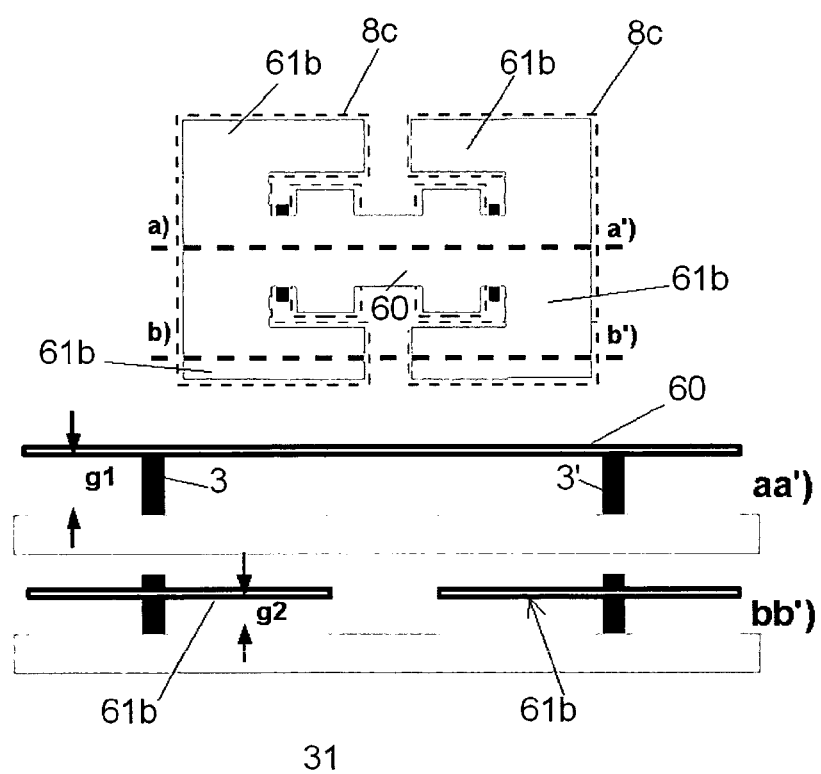

Other characteristics and advantages of the invention will appear more clearly on reading the following detailed description of several embodiments of the invention. This detailed description is made by way of non-exhaustive and non-limiting examples, and with reference to the accompanying drawings on which:

FIG. 1 is a section view (in plane I-I of FIG. 4) of a capacitive RF MEMS switch of the invention, the flexible membrane being in its rest position, FIG. 2 is a section view of the switch of FIG. 1, the flexible membrane being in its down forced state, FIG. 3 is a section view of the switch of FIG. 1, the flexible membrane being in its up forced state, FIG. 4 is a top view of the capacitive RF MEMS switch of FIGS. 1 to 3, FIGS. 4A, 5 to 7 are top views of other examples of capacitive RF MEMS switch of the invention, showing other suitable geometries for the membrane and actuation areas, FIGS. 8 to 12 are top views of other examples of MEMS structure of the invention, showing other suitable geometries for the membrane and actuation areas, FIG. 13 is a top view and two cross-section views of an improved MEMS structure of the invention.

DETAILED DESCRIPTION

FIGS. 1 to 4 show a capacitive RF MEMS switch that is made according to preferred embodiment of the invention. For sake of clarity, it must be however underlined that the scope of the invention is not limited to a capacitive RF MEMS switch but encompasses any MEMS structure comprising a flexible membrane that can be actuated between an up forced state and a down forced state. The invention can be for example also practised for making ohmic contact RF MEMS switches or Micro-Opto-Electro-Mechanical Systems (MOEMS).

The capacitive RF MEMS switch of FIGS. 1 to 4 has a novel structure that is now going to be detailed, and can be manufactured by using conventional surface micromachining technologies.

Referring to FIGS. 1 to 3, the RF MEMS switch comprises a wafer 1 (for example made of silicon) forming the substrate of the switch. A thin dielectric layer 2, as passivation layer, is deposited onto the surface of said wafer 1. On the dielectric layer 2, the switch comprises:
two lateral pillars 3, 3' that are spaced-apart in the longitudinal direction X, each pillar 3, 3' extending in the transverse direction of FIG. 1 (see FIG. 4—transverse direction Y perpendicular to the longitudinal direction X),
one central pillar 4 that extends in the transverse direction Y, the said central pillar 4 being positioned between the two lateral pillars 3, 3' and preferably at the centre between pillars 3, 3'.

In contrast with the lateral pillars 3, and 3', the top surface of the central pillar 4 is covered by a thin dielectric layer 5 for the capacitive switch configuration.

The two lateral pillars 3,3' and the central pillar 4 form a Coplanar Waveguide (CPW), the two lateral pillars 3,3' corresponding to the ground lines. The central pillar 4 forms the signal line for the transmission of the RF electric signal within the coplanar waveguide (CPW). In another variant, the RF signal line can be also implemented by mean of a microstrip waveguide.

The lateral pillars 3,3' and the central pillar 4 are for example made of a metal such as gold or gold alloy. The dielectric material for layers 2 and 5 can be any material, and notably polymer, with a very low electrical conductivity. For example, the dielectric layers 5 can be made of silicon nitride, $Ta_2O_5$, AlN, $Al_2O_3$.

The RF MEMS switch further comprises a switch element which is constituted by a thin flexible membrane 6 of longitudinal axis 6a (FIG. 4). is Said flexible membrane 6 is positioned above the pillars 3, 3', 4. The longitudinal axis 6a of membrane 6 is parallel to aforesaid longitudinal direction X and perpendicular to aforesaid transverse direction Y. Both ends 6b, 6c of the membrane 6 are not clamped on the substrate 1, and the membrane is thus freely supported at rest (FIG. 1) by the pillars 3, 3.' In the variant of FIG. 1, the flexible membrane 6 is spaced apart from the central pillar 4, and is thus not supported at rest by said central pillar 4.

In another variant, the flexible switch membrane 6 could be however supported at rest by the central pillar 4.

This flexible membrane 6 is made of metal for example such as aluminium, gold, or any conductive alloy.

FIG. 4 shows an example of geometry for the membrane 6. Other suitable geometries for the membrane 6 are shown on FIGS. 5 to 7 and will be hereafter described in details.

Referring to the particular embodiment of FIG. 4, the membrane 6 comprises a main central flexible part 60 that is supported by pillars 3, 3' and extends substantially between the two lateral pillars 3, 3'. Said central flexible part 60 is referred therein as the "functional part" of the membrane 6, and can be bended up or down longitudinally (i.e. in the longitudinal direction X) by a lever effect on the pillars 3, 3'. This functional part 60 forms a rectangle of width I1 and of length L1, and comprises two rectangular parts 60a and 60b of larger width I2. Rectangular part 60a is positioned between the lateral pillar 3 and the central pillar 4, and rectangular part 60b is positioned between the lateral pillar 3' and the central pillar 4.

The functional part 60 of the membrane 6 is extended at both ends by two extensions 61 having a substantial U shape. Each extension 61 is referred therein as "non-functional part" of the membrane 6. These "non-functional part" constitute actuation area that are usually not present on clamped-clamped or cantilever MEMS structures.

Each non-functional part 61 of the membrane 6 comprises a central non-functional part 61a forming the base of the U shape and two lateral non-functional parts 61b. Each lateral non-functional parts 61b forms a rectangle of length L3 (dimension measured in the longitudinal direction X) and of width I3 (dimension measured in the transverse direction Y). The two lateral non-functional parts 61b of a U shape non-functional part 61 are positioned on each side of the functional part 60 of the membrane 6 in the transverse direction Y. For sake of clarity, the four lateral non-functional parts 61b of the membrane 6 have been hatched on FIG. 4.

When the membrane 6 is at the rest position of FIG. 1, each central non-functional part 61a is positioned outside the pillars 3, 3' in the longitudinal direction X; each lateral non-functional part 61b of the membrane 6 is positioned outside the corresponding lateral pillar 3 or 3' in the transverse direction Y and extends on both sides of the corresponding lateral pillar 3 or 3' in the longitudinal direction X. Furthermore, a space 62 is provided between the main flexible functional part 60 of the membrane 6 and each lateral non-functional part 61b, in such a way that each lateral non-functional part 61b of the membrane 6 is flexible and is able to be bended longitudinally (i.e. in the longitudinal direction X) independently of the main flexible functional part 60 of the membrane.

As already described in European patent application 1 705 676, the MEMS switch also preferably comprises stoppers 3a (referred as "bridge parts" in EP 1 705 676) that are positioned above each lateral pillar 3, 3', and that form a passage through which the central part 60 of the membrane 6 is freely positioned. These stoppers are shown only on FIG. 1, and for sake of clarity are not shown on FIGS. 2 and 3. These stoppers are used for maintaining the membrane 6 on the lateral pillars 3 and 3', but without hindering the membrane 6 from freely moving relatively to the lateral pillars 3 during normal use of the switch. These stoppers can be replaced by any other equivalent means.

The RF MEMS switch further comprises electrostatic lowering actuating means 7 that are used for bending down longitudinally the membrane 6 into the down forced state of FIG. 3, and electrostatic raising actuating means 8 that are used for bending up longitudinally the membrane 6 into the up forced state of FIG. 2.

The electrostatic lowering actuating means 7 are formed by two internal electrodes 7a, 7b, that are positioned under the functional part 60 of the membrane 6. The internal electrodes 7a extends between the lateral pillar 3 and the central pillar 4. The internal electrodes 7b extends between the central pillar 4 and the lateral pillar 3'. More particularly, in reference to FIG. 4, the two internal electrodes 7a, 7b delimit two internal lowering actuation areas 7c (symbolised by dotted lines). When the membrane 6 is at rest (FIG. 1 and FIG. 4), each internal lowering actuation area 7c is positioned under rectangular parts 60a, 60b of the functional part 60 the membrane 6.

The electrostatic raising actuating means 8 are formed by two external electrodes 8a, 8b, having substantially the same U shape than the non-functional part 61 of the membrane 6. In reference to FIG. 4, the two external electrodes 8a, 8b delimit two raising actuation areas 8c (symbolised by dotted lines). When the membrane 6 is at rest (FIG. 1 and FIG. 4), each raising actuation area 8c is positioned under a non-functional part 61 the membrane 6. More particularly, each raising actuation area 8c comprises lateral parts that are positioned under the lateral non-functional parts 61b of the membrane and thus extends on both sides of a lateral pillar 3 or 3' in the longitudinal direction X.

When the switch is a RF capacitive switch, the top surface of each electrode 7a 7b 8a, 8b is covered by a dielectric layer 9 (FIG. 1) in order to avoid any ohmic contact between the membrane 6 and the electrodes. The dielectric layers 9 can be made of silicon nitride, $Ta_2O_5$, AlN, $Al_2O_3$. Such dielectric layers 9 can be replaced by any other equivalent means that enable to avoid an ohmic contact between the membrane 6 and the electrodes. In another variant, the dielectric layers 9 can be suppressed; in such a variant, the Mems switch comprises abutment means for preventing the membrane to come into contact with the actuation electrodes 7a, 7b, 8a, 8b.

Rest State

When no actuation voltage is applied on the electrodes 7a, 7b, 8a and 8b, the membrane 6 of the switch is in the rest position of FIG. 1 (rest state). In this rest state, the membrane 6 is substantially planar and is supported by the pillars 3, 3', with a predetermined gap g between the membrane 6 and the substrate 1. In another variant, the membrane could be bended at rest.

Down Forced State

When an actuation voltage is applied on the internal electrode 7a, 7b, electrostatic pulling forces are generated within actuation area 7c and are pulling down the functional part 60 of the membrane 6. These pulling forces are bending down longitudinally the membrane 6 into the down forced state of FIG. 2. In this down forced state, due to a lever effect on the pillars 3 and 3', the gap Gint between the substrate 1 and each end 6b, 6c of the membrane 6 is high, and in particular is higher than gap g in the rest state.

From Down Forced State to Up Forced State—Zipping Effect

In order to move the membrane 6 from the down forced state of FIG. 2 to the up forced state of FIG. 3, no actuation voltage is applied on electrodes 7a and 7b and simultaneously an actuation voltage is applied on the electrodes 8a, 8b. Electrostatic forces are generated within raising actuation area 8c and are pulling down the non-functional parts 61 of the membrane 6. More especially, electrostatic pulling down forces are exerted on each non-functional parts 61 of the membrane 6 simultaneously on both sides of each lateral pillar 3 or 3' in the longitudinal direction X.

In another variant, for moving the membrane 6 from the down forced state to the up forced state, in a first step an actuation voltage can be applied on the electrodes 8a, 8b, while maintaining the actuation voltage on electrodes 7a, 7b. Then in a second step, after a predetermined duration (for example a duration corresponding to the switching time of the switch), no actuation voltage is applied on electrodes 7a and 7b.

Referring to FIG. 2, in the down forced state, the gap G' measured between the substrate 1 and the membrane 6 in the area between the lateral pillars 3, 3' is smaller than the gap Gint measured between the substrate 1 and each end 6b, 6c of the membrane 6. In the down forced state, the internal end 61d (FIG. 4) of each lateral non-functional part 61b of the membrane 6 is thus closer to the raising actuation area 8c than the opposite external end 61e of said lateral non-functional part 61b. At the beginning of the switching movement of the membrane 6 from the down forced state, for a predetermined actuation voltage, the electrostatic pulling forces that are exerted within the actuation areas 8c are thus higher on the internal end 61d (FIG. 4) of each lateral non-functional part 61b and are smaller on the opposite external end 61e of said lateral non-functional part 61b. The non-functional parts 61 of the membrane are thus bended down and stick against the actuation areas 8c progressively from the internal end 61d of the lateral non-functional part 61b towards the external end 61e of the lateral non-functional part 61b and the central non-functional parts 61a. This phenomenon of progressive sticking of the non-functional part 61b is referred therein as "zipping effect". Thanks to this zipping effect and to a lever effect on the lateral pillars 3, 3', the membrane 6 is thus bended up longitudinally into the up forced state of FIG. 3.

As already underlined, the gap Gint in the down forced state is high, and notably higher than gap g in the rest position. This high gap Gint can be problematic for the transition from the down forced state to the up forced state. If the membrane 6 of the switch was only comprising central non-functional parts 61a, and was not comprising the lateral non-functional parts 61b, and if the electrodes 8a, 8b were not comprising any extension under such lateral non-functional parts 61b, the electrostatic pulling forces would be exerted only on the central non-functional parts 61a of the membrane which are far (gap Gint) from the electrodes 8a, 8b. The foresaid zipping effect would not be obtained and such a topology (without lateral non-functional parts 61b) would detrimentally require higher actuation voltages.

In contrast, with the invention, since the internal end 61d of each lateral non-functional part 61b of the membrane 6 is close to the raising actuation area 8c in the down-forced state, the aforesaid zipping effect can be advantageously started and obtained with a low actuation voltage, and in particular with an actuation voltage that is advantageously much lower than the actuation voltage that would be required if the membrane was not comprising the lateral non-functional parts 61b. The switching of the membrane 6 from the down forced state to the up forced state is thus advantageously obtained with a lower actuation voltage.

Furthermore, there is a high risk that the membrane 6 sticks onto the substrate of the MEMS structure in the down forced state. So-called stiction phenomenon is well-known and can be due to:

Dielectric charging: the membrane 6 can be subjected to an electrostatic force that maintains the membrane in the down state, even if the electric lowering actuation means for the down state are cut-off.

Capillarity: this phenomenon appears when the gap between the moving part of the membrane 6 and the substrate 1 in the down state is very low and the humidity level is high (typically >30% RH).

Surface adhesion forces (Van der Walls forces): this phenomenon appears in case of metal/metal contact in ohmic contact MEMS switches In case of metal/metal contact in ohmic contact MEMS switches, a partial melting of the membrane can occur, thereby causing a light welding of membrane on the metallic contacts.

With a typology wherein the membrane 6 of the switch would only comprise central non-functional parts 61a, and would not comprise lateral non-functional parts 61b, and wherein the electrodes 8a, 8b would not comprise any extension under such lateral non-functional parts 61b, there would be a high risk of failure of the switch when a stiction phenomenon of the membrane 6 occurs.

In comparison, in the invention, when an actuation voltage is applied on the electrodes 8a, 8b, because the aforesaid gap G' is low and thanks to the aforesaid zipping effect, an electrostatic force is added to the mechanical restoring force of the membrane, and the total pull-off force of the switch is enhanced. A lower actuation voltage can thus advantageously be used, without prejudice for the efficiency of the switch. With the switch of the invention, because the total pull-off force of the switch is enhanced, the stiction phenomenon can be solved more easily.

Another advantage of the large pull-off force of the MEMS structure of the invention is the hot switching ability, particularly for a RF MEMS structure, i.e. switching ability of the membrane when a potential is applicated in the RF lines.

In order to maximize the efficiency of the lateral non functional parts 61b, the MEMS structure can be modified by locally reducing the gap between the lateral non functional parts 61b and the substrate 1 as shown on FIG. 13. In reference to this FIG. 13, the gap g2 between the lateral non functional parts 61b and the substrate 1 is advantageously smaller than the gap g1 between the functional part 60 of the membrane 6 and the substrate. This gap reduction can be obtained by a step of partial sacrificial etching in the thickness. Optionally, the gap between the central non-functional parts 61a and the substrate 1 can be also advantageously smaller than the gap g1 between the functional part 60 of the membrane 6 and the substrate.

More particularly, in order to increase the efficiency of the lateral non functional parts 61b, the MEMS structure can be modified by reducing the stiffness of the lateral non functional parts 61b. This is obtained by reducing the thickness of the lateral non functional parts 61b, i.e. by making a MEMS structure wherein the thickness of a non-functional part 61b is smaller than the thickness of the functional part 60 of the membrane 6. This thickness reduction improves the actuation of the MEMS structure because it reduces the stiffness of the lateral non functional parts 61b and the propagation of actuation during the zipping effect is thereby enhanced.

These two improvements (gap reduction and thickness reduction) can be practised for improving any MEMS structure of the invention comprising lateral non-functional part(s) 61b, and in particular can be also practised for improving the embodiments of FIGS. 5 to 12.

FIGS. 4A, and 5 to 7 shows three other examples of geometry for the membrane 6.

Figure 4A:
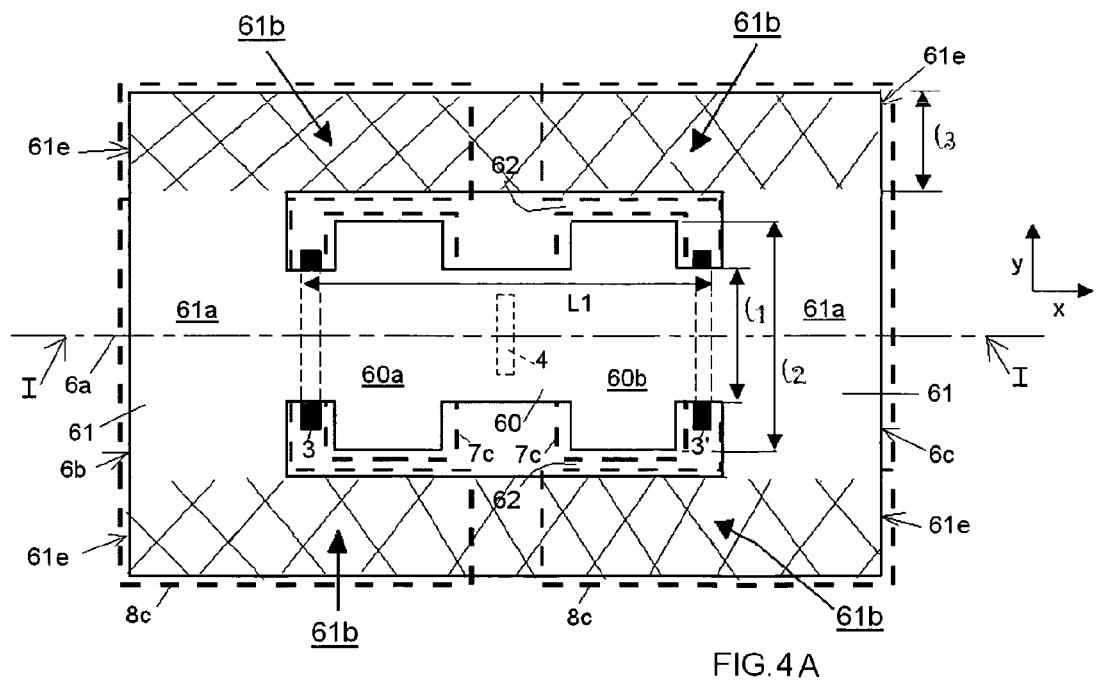

FIG. 4A shows another variant wherein the right and left lateral non-functional parts 61b are joined together.

Figure 5:
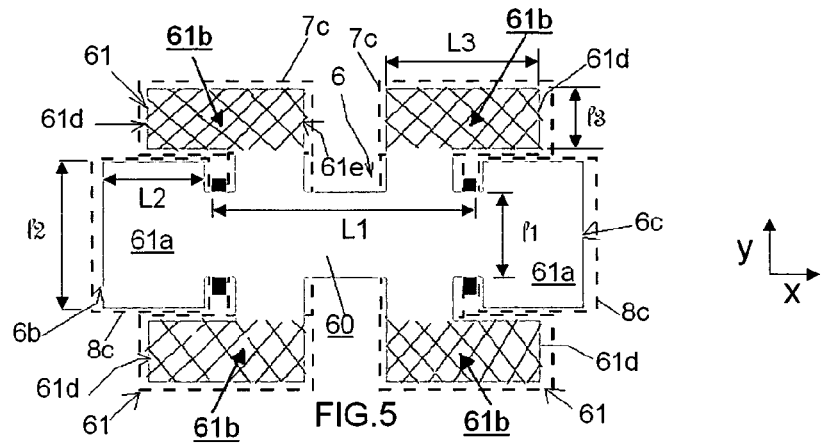

In the embodiment of FIG. 5, the membrane 6 comprises a central functional part 60 that extends between the two lateral pillars 3. This central functional part 60 forms a rectangle of length L1 and of width I1. The central functional part 60 of the membrane 6 is extended at each end 6b, 6c by a non-functional part 61a having a rectangular shape of width I2 (I2≥I1).

The central functional part 60 of the membrane 6 is also extended laterally by four extensions 61 having a L shape and forming four lateral non-functional parts 61b of length L3 and width l3. Theses two lateral non-functional parts 61b are positioned on each side of the functional part 60 of the membrane 6 in the transverse direction (Y). Each lateral non-functional part 61b is positioned outside the pillar 3 or 3' in the transverse direction Y and extends on both sides of a pillar 3 or 3' in the longitudinal direction X.

The two internal electrodes 7a, 7b delimit two internal lowering actuation areas 7c (symbolised by dotted lines) having substantially a U shape. When the membrane 6 is at rest (FIG. 1 and FIG. 4), parts of each internal lowering actuation area 7c extend under the lateral non-functional part 61b of the membrane and thus extend on both sides of a lateral pillar 3 or 3'in the longitudinal direction X.

The two external electrodes 8a, 8b delimit two raising actuation areas 8c (symbolised by dotted lines). When the membrane 6 is at rest (FIG. 1 and FIG. 4), each raising actuation area 8c is positioned under a central non-functional part 61a the membrane 6.

When the membrane 6 is in the up forced-state, because of the bending of the membrane 6 (FIG. 2), the end 61d (FIG. 5) of each lateral non-functional part 61b of the membrane 6 is closer to the lowering actuation area 7c than the opposite end 61e of said lateral non-functional part 61b.

For switching the membrane 6 of FIG. 5 from the up forced state to the down forced state, no actuation voltage is applied on electrodes 8a and 8b and an actuation voltage is simultaneously applied on the electrodes 7a, 7b. Electrostatic forces are generated within lowering actuation area 7c and are pulling down the extension 61 of the membrane 6. More especially, electrostatic pulling down forces are exerted on each lateral non-functional parts 61b of the membrane 6 simultaneously on both sides of each lateral pillar 3 or 3' in the longitudinal direction X and a zipping effect (as the one previously described for the membrane of FIG. 4) is advantageously obtained on the lateral non functional parts 61b of the membrane 6. Thanks to this zipping effect, the actuation voltage needed for switching the membrane from the up forced state to the down forced state is advantageously lowered.

In another variant, for moving the membrane 6 from the up forced state to the down forced state, in a first step an actuation voltage can be applied on the electrodes 7a, 7b, while maintaining the actuation voltage on electrodes 8a, 8b. Then in a second step, after a predetermined duration (for example a duration corresponding to the switching time of the switch), no actuation voltage is applied on electrodes 8a and 8b.

For the variant of FIG. 5, the aforesaid improvement related to the gap reduction is obtained with a gap g2 at rest between the substrate 1 and each lateral non-functional part 61b that is smaller than the gap g1 at rest between each central non-functional part 61a of the membrane 6 and the substrate 1.

For the variant of FIG. 5, the aforesaid improvement related to the thickness reduction is obtained with a thickness of each lateral non-functional part 61b that is smaller than the thickness of the central non-functional part 61a of the membrane.

Figure 6:
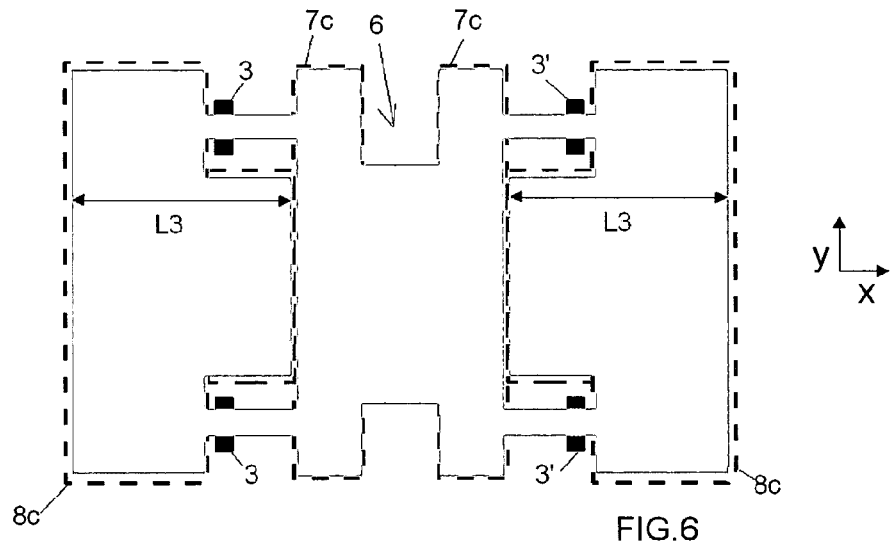

FIG. 6 shows another embodiment of the invention wherein the membrane 6 is supported on four pillars 3, 3'. The raising actuation areas 8c (symbolised by dotted lines) extend under the membrane 6 on both sides (length L3) of a supporting pillar 3 or 3' in the longitudinal direction X. During the switching movement of the membrane 6 from the down-forced state to the up forced state, a zipping effect is obtained in the two areas of length L3 of the membrane 6 that are positioned above the raising actuation areas 8c.

Figure 7:
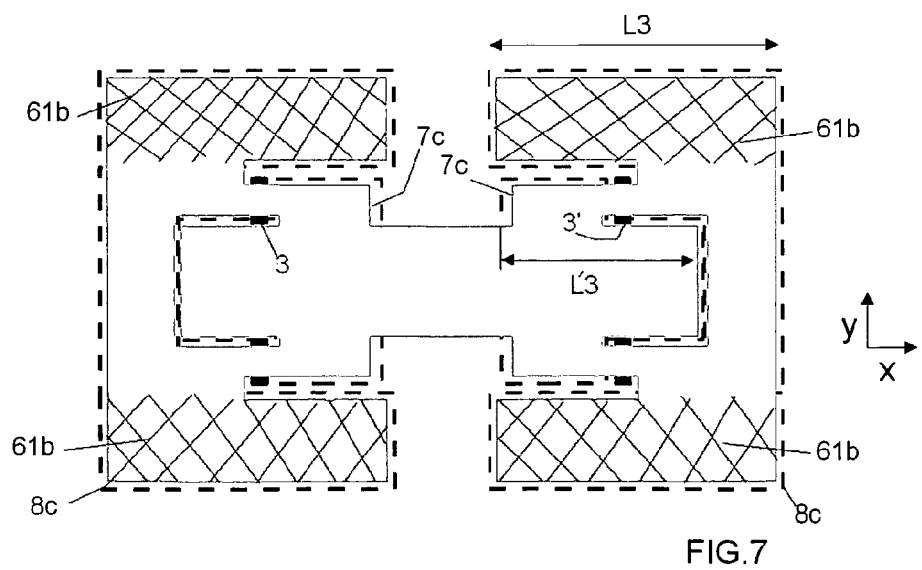

FIG. 7 shows another embodiment of the invention wherein the raising actuation areas 8c (symbolised by dotted lines) extend under the membrane on both side (length L3) of a supporting pillar 3 or 3' in the longitudinal direction X, and the lowering actuation areas 7c (symbolised by dotted lines) extend under the membrane on both side (length L'3) of a supporting pillar 3 or 3' in the longitudinal direction X. The membrane 6 comprises four lateral non-functional parts 61b that are similar to the ones of the embodiment of FIG. 4. In this embodiment, during the switching movement of the membrane 6 from the down-forced state to the up forced state, a zipping effect is obtained in theses lateral non-functional parts 61b, as previously described for the embodiment of FIG. 4. During the switching movement of the membrane 6 from the up-forced state to the down forced state, a zipping effect is obtained in the two areas of length L'3 of the membrane 6 that are positioned above the lowering actuation areas 7c.

The invention is not limited to a MEMS structures having a membrane 6 that is freely supported on pillars, but can be also be practised with any MEMS comprising a membrane that can be bended down longitudinally into a down forced state and than can be bended up longitudinally into a up forced state by using electric actuation means and a lever effect on one or several pillars.

FIGS. 8 to 12 shows other embodiments of the invention. On these FIGS. 8 to 12, the black dot C symbolized a contact area of the functional part 60 of the switch membrane 6 when the membrane is in the down-state.

Figure 8:
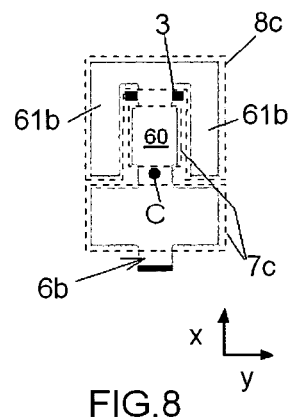
Figure 9:
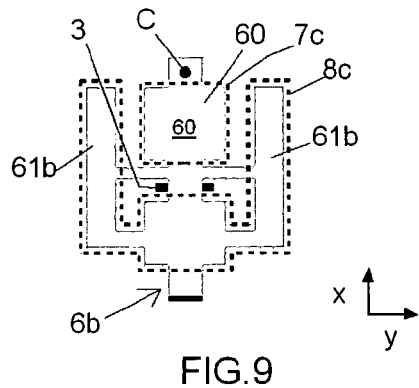

In the embodiments of FIGS. 8 and 9, the membrane 6 forms a cantilever beam that is clamped at one end 6b on the substrate 1, and is supported in the rest state by one pillar 3.

More particularly, in the embodiment of FIG. 8, the contact area C of the switch membrane 6 is positioned between the pillar 3 and the clamped end 6b of the membrane. The membrane 6 comprises two lateral non-functional parts 61b. Each lateral non-functional part 61b is positioned outside the pillars 3 in the transverse direction Y and extends on both sides of pillar 3 in the longitudinal direction X. There is one electric raising actuation area 8c that extends under the membrane 6 and on both sides of pillar 3 (under lateral non-functional parts 61b) in the longitudinal direction X of the membrane. There are two electric lowering actuation areas 7c.

More particularly, in the embodiment of FIG. 9, the pillar 3 is positioned between the contact area C of the switch membrane 6 and the clamped end 6b of the membrane. The membrane 6 comprises two lateral non-functional parts 61b. Each lateral non-functional part 61b is positioned outside the pillars 3 in the transverse direction Y and extends on both sides of pillar 3 in the longitudinal direction X. There is one lowering actuation areas 7c and one electric raising actuation area 8c. The electric raising actuation area 8c extends under the membrane 6 and on both sides of pillar 3 (under lateral non-functional parts 61b) in the longitudinal direction X of the membrane.

Figure 10:
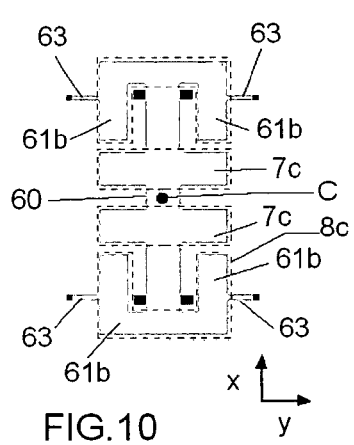

In the embodiments of FIGS. 10 to 12, the membrane 6 is a clamped-clamped membrane that is positioned above pillars 3, 3'. More particularly, the membrane 6 is maintained at both ends 6b, 6c by arms 63 that are clamped to the substrate. At rest the membrane 6 can be either supported or not supported by the two pillars 3, 3'.

The invention claimed is:
1. A MEMS structure comprising:
 a flexible membrane including a main longitudinal axis defining a longitudinal direction;
 at least one pillar under the flexible membrane;
 electric lowering actuation means adapted to bend down the flexible membrane into a down forced state; and electric raising actuation means adapted to bend up the flexible membrane into an up forced state;

wherein the membrane includes a flexible functional part that is positioned above said at least one pillar and is adapted to be bent down or up by a lever effect on said at least one pillar;

wherein the membrane includes at least one flexible lateral non-functional part that is outside said at least one pillar in a transverse direction, and extends on both sides of said at least one pillar in the longitudinal direction;

wherein an actuation area of the electric lowering actuation means or an actuation area of the electric raising actuation means extends under said at least one lateral non-functional part and is adapted to exert pulling forces on said at least one lateral non-functional part of the membrane simultaneously on both sides of said at least one pillar in the longitudinal direction;

wherein the at least one flexible lateral non-functional part is laterally offset from the at least one pillar and is partially aligned with the at least one pillar in the transverse direction; and wherein the at least one flexible lateral non-functional part extends further in the longitudinal direction than the at least one pillar.

2. The MEMS structure according to claim 1, wherein the membrane comprises at least two lateral flexible non-functional parts that are positioned on each side of the functional part of the membrane in the transverse direction.

3. The MEMS structure according to claim 1, further comprising a substrate, wherein the functional part of the membrane is extended at least at one end, in the longitudinal direction, by a central non-functional part, wherein said central non-functional part is extended in the transverse direction by at least a lateral non-functional part that is positioned outside said at least one pillar in the transverse direction and that extends on both sides of said at least one pillar in the longitudinal direction, and wherein the gap at rest between the substrate and said lateral non-functional part is smaller than the gap at rest between the functional part of the membrane and the substrate.

4. The MEMS structure according to claim 1, wherein the functional part of the membrane is extended at least at one end, in the longitudinal direction, by a central non-functional part, wherein said central non-functional part is extended in the transverse direction by at least a lateral non-functional part that is positioned outside said at least one pillar in the transverse direction and that extends on both sides of said at least one pillar in the longitudinal direction, and the thickness of the lateral non-functional part is smaller than the thickness of the functional part of the membrane.

5. The MEMS structure according to claim 1, further comprising a substrate, wherein the functional part of the membrane is extended at least at one end, in the longitudinal direction, by a central non-functional part, wherein the functional part of the membrane is extended in the transverse direction at least by a lateral non-functional part that is positioned outside said at least one pillar in the transverse direction, and that extends on both sides of said at least one pillar in the longitudinal direction, and wherein the gap at rest between the substrate and said lateral non-functional part is smaller than the gap at rest between the central non-functional part of the membrane and the substrate.

6. The MEMS structure according to claim 1, wherein the functional part of the membrane is extended at least at one end, in the longitudinal direction, by a central non-functional part, wherein the functional part of the membrane is extended in the transverse direction at least by a lateral nonfunctional part that is positioned outside said at least one pillar in the transverse direction, and that extends on both sides of said at least one pillar in the longitudinal direction, and wherein the thickness of the lateral non-functional part is smaller than the thickness of the central non-functional part of the membrane.

7. The MEMS structure according to claim 1, wherein the electric lowering actuation means comprise an actuation area that extends under a part of the membrane and that is adapted to exert pulling forces on said part of the membrane simultaneously on both sides of said at least one pillar in the longitudinal direction, and the electric raising actuation means comprise an actuation area, that extends under another part of the membrane and that is adapted to exert pulling forces on said other part of the membrane on both sides of said at least one pillar in the longitudinal direction.

8. The MEMS structure according to claim 1, wherein the membrane is positioned above at least two pillars that are spaced apart in the longitudinal direction, and wherein the electric raising actuation means or the electric lowering actuation means comprise, for each pillar, an actuation area that extends under a part of the membrane and that is adapted to exert pulling forces on said part of the membrane simultaneously on both sides of the corresponding pillar in the longitudinal direction.

9. The MEMS structure according to claim 1, wherein the membrane is a free membrane whose both ends are not clamped to a substrate, and is supported at rest by said at least one pillar.

10. The MEMS structure according to claim 1, wherein the membrane is a cantilever membrane that is clamped at one end to a substrate.

11. The MEMS structure according to claim 1, wherein the membrane is a clamped-clamped membrane that is clamped at both ends to a substrate.

12. The MEMS structure according to claim 1, wherein the at least one flexible lateral non-functional part is positioned on one side of the functional part of the membrane in the transverse direction.

13. The MEMS structure according to claim 1, wherein the at least one flexible lateral non-functional part is offset from the main longitudinal axis.

14. The MEMS structure according to claim 1, wherein a portion of the flexible lateral non-functional part is co-planar with a portion of the flexible functional part in the transverse direction.

15. A MEMS structure comprising:
a flexible membrane including a main longitudinal axis defining a longitudinal direction;
at least one pillar under the flexible membrane;
electric lowering actuation means adapted to bend down the flexible membrane into a down forced state; and
electric raising actuation means adapted to bend up the flexible membrane into an up forced state;
wherein the membrane includes a flexible functional part that is positioned above said at least one pillar and is adapted to be bent down or up by a lever effect on said at least one pillar;
wherein the membrane includes at least one flexible lateral non-functional part that is outside said at least one pillar in a transverse direction, and extends on both sides of said at least one pillar in the longitudinal direction;
wherein an actuation area of the electric lowering actuation means or an actuation area of the electric raising actuation means extends under said at least one lateral non-functional part and is adapted to exert pulling forces on said at least one lateral non-functional part of the membrane simultaneously on both sides of said at least one pillar in the longitudinal direction; and wherein the membrane comprises at least two lateral flexible non-functional parts that are positioned on each side of a functional part of the membrane in the transverse direction.

16. The MEMS structure according to claim 15, further comprising a substrate, wherein the functional part of the membrane is extended at least at one end, in the longitudinal direction, by a central non-functional part, wherein said central non-functional part is extended in the transverse direction by at least the lateral non-functional part that is positioned outside said at least one pillar in the transverse direction and that extends on both sides of said at least one pillar in the longitudinal direction, and wherein a gap at rest between the substrate and said lateral non-functional part is smaller than the gap at rest between the functional part of the membrane and the substrate.

17. The MEMS structure according to claim 15, wherein the functional part of the membrane is extended at least at one end, in the longitudinal direction, by a central non-functional part, wherein said central non-functional part is extended in the transverse direction by at least the lateral non-functional part that is positioned outside said at least one pillar in the transverse direction and that extends on both sides of said at least one pillar in the longitudinal direction, and the thickness of the lateral non-functional part is smaller than the thickness of the functional part of the membrane.

18. The MEMS structure according to claim 15, further comprising a substrate, wherein the functional part of the membrane is extended at least at one end, in the longitudinal direction, by a central non-functional part, wherein the functional part of the membrane is extended in the transverse direction at least by the lateral non-functional part that is positioned outside said at least one pillar in the transverse direction, and that extends on both sides of said at least one pillar in the longitudinal direction, and wherein the gap at rest between the substrate and said lateral non-functional part is smaller than the gap at rest between the central non-functional part of the membrane and the substrate.

19. The MEMS structure according to claim 15, wherein the functional part of the membrane is extended at least at one end, in the longitudinal direction, by a central non-functional part, wherein the functional part of the membrane is extended in the transverse direction at least by the lateral nonfunctional part that is positioned outside said at least one pillar in the transverse direction, and that extends on both sides of said at least one pillar in the longitudinal direction, and wherein the thickness of the lateral non-functional part is smaller than the thickness of the central non-functional part of the membrane.

20. The MEMS structure according to claim 15, wherein the electric lowering actuation means comprise an actuation area that extends under a part of the membrane and that is adapted to exert pulling forces on said part of the membrane simultaneously on both sides of said at least one pillar in the longitudinal direction, and the electric raising actuation means comprise an actuation area, that extends under another part of the membrane and that is adapted to exert pulling forces on said other part of the membrane on both sides of said at least one pillar in the longitudinal direction.

21. The MEMS structure according to claim 15, wherein the membrane is positioned above at least two pillars that are spaced apart in the longitudinal direction, and wherein the electric raising actuation means or the electric lowering actuation means comprise, for each pillar, an actuation area that extends under a part of the membrane and that is adapted to exert pulling forces on said part of the membrane simultaneously on both sides of the corresponding pillar in the longitudinal direction.

22. The MEMS structure according to claim 15, wherein the membrane is a free membrane whose both ends are not clamped to a substrate, and is supported at rest by said at least one pillar.

23. The MEMS structure according to claim 15, wherein the membrane is a cantilever membrane that is clamped at one end to a substrate.

24. The MEMS structure according to claim 15, wherein the membrane is a clamped-clamped membrane that is clamped at both ends to a substrate.

25. The MEMS structure according to claim 15, wherein the at least one flexible lateral non-functional part is positioned on one side of the functional part of the membrane in the transverse direction.

26. The MEMS structure according to claim 15, wherein the at least one flexible lateral non-functional part is offset from the main longitudinal axis.

27. The MEMS structure according to claim 15, wherein the at least one flexible lateral non-functional part is laterally offset from the at least one pillar and is partially aligned with the at least one pillar in the transverse direction; and wherein the at least one flexible lateral non-functional part extends further in the longitudinal direction than the at least one pillar.

28. The MEMS structure according to claim 15, wherein a portion of the flexible lateral non-functional part is co-planar with a portion of the flexible functional part in the transverse direction.

* * * * *

UNITED STATES PATENT AND TRADEMARK OFFICE
CERTIFICATE OF CORRECTION

PATENT NO. : 8,593,239 B2
APPLICATION NO. : 13/203884
DATED : November 26, 2013
INVENTOR(S) : Karim Segueni et al.

It is certified that error appears in the above-identified patent and that said Letters Patent is hereby corrected as shown below:

In the Specification

Column 2, line 21, delete "force" and insert --forced--.

Column 2, line 34, delete "force" and insert --forced--.

Column 2, line 59, delete "force" and insert --forced--.

Column 4, line 37, delete "3," and insert --3--.

Column 4, line 40, delete "3,3'" and insert --3, 3'--.

Column 4, line 41, delete "3,3'" and insert --3, 3'--.

Column 4, line 47, delete "3,3'" and insert --3, 3'--.

Column 4, line 55, before "Said", delete "is".

Column 4, line 61, delete "3, 3.'" and insert --3, 3'.--.

Column 5, line 56, delete "3" and insert --3 and 3'--.

Column 6, line 8, before "the", insert --of--. (second occurrence)

Column 6, line 18, before "the", insert --of--.

Column 6, Line 24, delete "7a 7b" and insert --7a, 7b,--.

Column 6, Line 31, delete "Mems" and insert --MEMS--.

Column 7, Line 44, delete "down-forced state" and insert --down forced state--.

Column 7, Line 67, After "switches", insert --.--.

Signed and Sealed this
Seventeenth Day of February, 2015

Michelle K. Lee
*Deputy Director of the United States Patent and Trademark Office*

CERTIFICATE OF CORRECTION (continued)
U.S. Pat. No. 8,593,239 B2

Column 8, Line 61, delete "3." and insert --3 and 3'.--.

Column 9, Line 13, delete "3'in" and insert --3' in--.

Column 9, Line 18, before "the", insert --of--.

Column 9, Line 19, delete "up forced-state" and insert --up forced state--.

Column 9, Line 64-65, delete "down-forced state" and insert --down forced state--.

Column 10, Line 11, delete "down-forced state" and insert --down forced state--.

Column 10, Line 15, delete "up-forced state" and insert --up forced state--.

Column 10, Line 28, delete "down-state." and insert --down forced state.--.